US006334249B2

(12) United States Patent
Hsu

(10) Patent No.: US 6,334,249 B2
(45) Date of Patent: Jan. 1, 2002

(54) CAVITY-FILLING METHOD FOR REDUCING SURFACE TOPOGRAPHY AND ROUGHNESS

(75) Inventor: Wei-Yung Hsu, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/064,492

(22) Filed: Apr. 22, 1998

Related U.S. Application Data

(60) Provisional application No. 60/044,523, filed on Apr. 22, 1997.

(51) Int. Cl.$^7$ ................................................. H01K 3/10

(52) U.S. Cl. ............................ 29/852; 29/830; 29/846; 204/192.17; 427/96; 427/97; 427/99; 438/637; 438/644; 438/648; 438/660; 438/675; 438/688

(58) Field of Search ............................... 427/97, 98, 96, 427/99; 438/688, 644, 637, 636, 675, 648, 650, 660; 252/250; 204/192.17; 29/846, 847, 852, 830

(56) References Cited

U.S. PATENT DOCUMENTS

| | | | |
|---|---|---|---|
| 4,045,594 A | 8/1977 | Maddocks | 427/89 |
| 4,488,162 A | 12/1984 | Jambotkar | 357/23 |
| 4,489,481 A | 12/1984 | Jones | 29/591 |
| 4,507,853 A | 4/1985 | McDavid | 29/591 |
| 4,520,041 A | 5/1985 | Aoyama et al. | 427/88 |
| 4,544,445 A | 10/1985 | Jeuch et al. | 156/643 |
| 4,592,802 A | 6/1986 | Deleonibus et al. | 156/644 |
| 4,656,732 A | 4/1987 | Teng et al. | 29/591 |
| 5,363,550 A | * 11/1994 | Aitken et al. | 29/852 |
| 5,656,542 A | * 8/1997 | Miyata et al. | 438/648 |
| 5,918,149 A | * 6/1999 | Besser et al. | 438/680 |
| 5,985,763 A | * 11/1999 | Hong et al. | 438/688 |
| 6,143,645 A | 11/2000 | Hsu et al. | 438/627 |

OTHER PUBLICATIONS

Jun. 27–29, 1995 VMIC Conference, "A Multilevel Al–Plug Technology for Sub–Half Micron Metallization", pp. 537–543 (P.J. Holverson, C.D. Dobson, Paul Rich, D.C. Butler, G.R. Green, M.G.M. Harris and Arthur McGeown, G.A. Dixit. S. Poarch, K. Hamamoto, B. Bohannon, W.Y. Hsu and R.H. Havemann).

Mat. Res. Soc. Symp. Proc. vol. 354, 1995 Materials Research Society, "Directional Sputter Deposition for Semiconductor Applications", pp. 503–510 (S.M. Rossnagel).

(List continued on next page.)

Primary Examiner—Lee Young
Assistant Examiner—Rick Kiltae Chang
(74) Attorney, Agent, or Firm—Jacqueline J. Garner; W. James Brady, III; Frederick J. Telecky, Jr.

(57) ABSTRACT

A method of minimizing the volume of the depressions 240 in aluminum cavity filling processes, by-depositing a conformal first layer of aluminum alloy 220 by chemical vapor deposition, long-throw sputtering, collimated sputtering, or ionized physical vapor deposition, to partially fill the cavity 202. This layer is preferably deposited at low temperature (eg. less than 300 degrees C.) and lower deposition pressure (if deposited by sputtering). Subsequently, a second layer of aluminum alloy 230 is deposited by sputtering at temperatures greater than 350 degrees C. and at high power (e.g. greater than 10 kW) to close the mouth of cavity 202. The second layer of aluminum 230 is then forced into the remaining volume of the cavity 202. As part of the cavity 202 is filled with aluminum, alloy 220 before the high pressure aluminum extrusion/reflow, less material is required to be transported into the cavity 202. Therefore, a smaller depression 240 above the cavity is produced. This method is particularly advantageous in multi-level interconnect applications involving aluminum cavity filling.

6 Claims, 6 Drawing Sheets

OTHER PUBLICATIONS

"A Prcocess to Incorporate CVD TiN as Barriers for Quarter Micron Contacts With High Pressure Extruded Al Alloy", pp. 1–7 (Wei–Yung Hsu, Girish Dixit, Jiong–Ping Lu, Qi–Zhong Hong, Anthony Konecni, J.D. Luttmer, and R.H, Havemann).

1996 IEEE, "A Novel Low Temperature PVD Planarized Al–Cu Process for High Aspect Ratio Sub–Half Micron Interconnect", pp. 14.2.1–14.2.4 (B. Zhao, M.A. Biberger, V. Hoffman, S.Q. Wang, P.K. Vasudev, and T.E. Seidel).

* cited by examiner

CAVITY-FILLING METHOD FOR REDUCING SURFACE TOPOGRAPHY AND ROUGHNESS

This application claims priority under 35 USC § 119 (e) (1) of provisional application number 60/044,523, filed Apr. 22, 1997.

BACKGROUND AND SUMMARY OF THE INVENTION

The present invention relates to integrated circuit metallization structures and fabrication methods.

Background: Aluminum Metallization

In modern integrated circuit fabrication, it is increasingly necessary to fill vias and contact holes which have a high "aspect ratio". This means a ratio of height to width which is 2:1 or more, and, as technology progresses, may be as high as 10:1 or more in future generations. Completely filling such holes with metal at an acceptably low temperature is very difficult, particularly for metals (such as aluminum and copper) which do not have a good low-temperature chemical vapor deposition (CVD) process. Moreover, even a good CVD process will not fill holes of infinitely high aspect ratios. The seamline within the cavity filled with CVD aluminum or copper will transform into a void and obstruct the current flow, resulting in a low electromigration lifetime.

Recently, contact and via filling with aluminum alloys has attracted a great deal of attention. Compared with contact/via filling with CVD tungsten, aluminum filling has the advantages of lower cost, higher yield, and potentially better electromigration resistance (since there is less flux divergence near the plug).

However, one concern with aluminum metallization is still electromigration: a pure aluminum line may gradually thin out, in service, in locations of high current density. However, the addition of copper greatly reduces this tendency. Longer electromigration (EM) lifetimes improve the product reliability. Thus, typical aluminum alloys use copper (typically one-half weight percent to one weight percent), alone or in combination with silicon (typically one-half weight percent to one weight percent), as an alloying agent. Efforts have been made to find other satisfactory aluminum alloy compositions; see e.g. Kikuta and Kikkawa, "Electromigration characteristics for Al—Ge—Cu," 143 J. Electrochem. Soc. 1088 (1996), which is hereby incorporated by reference.

Background: Aluminum Plug Processes

As shown in prior art FIG. 5, a contact or via hole 502 has been etched through a dielectric layer 510 to expose an underlying layer 500, followed by the filling of the cavities 502 with a layer of aluminum or aluminum alloy 520 and the etchback (or CMP) of the aluminum layer 520 on top of the dielectric 510 to form aluminum plugs 520. As can be seen in FIG. 5, after the etchback of the aluminum layer 520, the aluminum material 520 is typically recessed 530 from the surface of the dielectric layer 510. This can undesirably result in a similar depression 550 forming in subsequently deposited metal layers 540.

Aluminum plugs may be formed by a variety of methods, including sputter-reflow, blanket CVD, selective CVD, or high pressure extrusion fill followed by an isotropic etch step or a chemical mechanical polishing (CMP) process to remove any excess aluminum. Reflow methods apply a high temperature to help newly-arrived atoms to move around on the metal surface. Extrusion cavity filling methods (like the "Forcefill" (TM) process) apply physical pressure at high temperatures to force a soft layer of as-deposited material into the hole. The forcefill process is uniquely advantageous in filling contact or via holes with extremely high aspect ratios. Indeed, as of 1997, it appears that forcefill is the only known technique for filling holes with aspect ratios which are significantly greater than three to one.

A liner layer 505 (e.g. titanium silicide) is required for sputter-reflow, blanket CVD and high pressure extrusion fill. The liner layer 505 may also serve as a wetting layer which lowers the melting point and yield stress of the aluminum, as discussed in U.S. Provisional Patent Application Serial No. 60/037,123, filed Feb. 3, 1997, which is hereby incorporated by reference. In addition, various conductive coatings have been used on contact or via sidewalls in the prior art. For example, a barrier and adhesion layer (e.g. titanium nitride on titanium) is very commonly used. Such barrier, adhesion, and liner layers will typically be only about a few tens of nanometers thick.

In a typical CVD filling process, CVD has the disadvantage that a join 705 occurs in the middle of the cavity 720 when the cavity 720 is fully filled with CVD metal 700, which is illustrated in prior art FIG. 7A. After the metal 700 is heated, this join will become a bubble 710, as shown in prior art FIG. 7B, which increases the net series resistance of the contact or via connection. CVD aluminum processes can achieve reasonably high rates of deposition (currently up to about 200 nanometers per minute), but are typically much more expensive than sputter deposition.

Background: Depression Formation in Aluminum Cavity-Filling Processes

In aluminum cavity-filling processes, the aluminum layer on top of the dielectric material and over the cavities is not etched back as in aluminum plug processes. As shown in prior art FIGS. 3A and 3B, the aluminum 320 is typically sputter deposited at a high temperature with a rapid deposition rate. This causes small cavities 310 to be readily bridged, with only a fairly small volume of metal 320 intruding into the cavity 310 (e.g. less than 10 percent of the volume of cavity 310), as shown in FIG. 3A. After the filling of the cavities 310 with an aluminum alloy 320 (e.g. by reflow or extrusion), a depression 330 typically forms over the cavity 310 (e.g. via, contact, or trench within a dielectric layer 300). This depression 330 is a result of mass conservation, as the aluminum alloy 320 deposited on the surface, shown in FIG. 3A, is transferred into the cavity 310, which is illustrated in FIG. 3B. The volume of the depression 330 shown in FIG. 3B typically equals the volume of the cavity 310.

A smooth surface can be achieved if the reflow or extrusion process is carried out at elevated temperature (e.g. greater than 450 degrees C.), or in an ultra-high vacuum (e.g. pressure less than 1E-8 Torr) to promote the surface diffusion of aluminum, which will smooth out the surface. However, at low temperatures (less than 450 degrees C., such as is required for use with low-k dielectrics) or in poor vacuum conditions ($10^5$ Torr or softer vacuum), the materials diffusion rate is too slow to smooth the surface, and thus a depression forms above the cavity.

These depressions undesirably are picked up as defects by defect detection tools, which increases the cycle time. A further problem with the formation of large depressions is that present lithography is unable to pattern small features above these depressions. These depressions are also undesirable for stacked via applications, because gap fill material, such as Hydrogen Silsesquioxane (HSQ) coated by spin-coating, becomes coated in the depression, making it difficult to perform subsequent via etching, since HSQ has a much slower etch rate than oxide dielectrics. Furthermore, as can be seen in prior art FIG. 4, these depressions 400 and 410 produce rough surfaces and increase the surface topography over dense cavity regions 420 and 430, because the depressions 400 and 410 above the cavities 420 and 430 overlap and compete for materials needed to fill the cavities 420 and 430, which results in incomplete filling of the cavities 420 and 430.

Background: Graded-Temperature Aluminum Reflow

One conventional method of reducing the depression volume in aluminum cavity-filling processes uses a graded temperature aluminum deposition process, which is described in U.S. Pat. No. 5,108,951 to Chen et al. This process deposits a single aluminum layer, with temperature ramping, so that the aluminum is initially deposited at a low temperature, in order to reduce the likelihood of contact spiking and to begin deposition of aluminum into the cavity. Thereafter, the temperature is ramped up to a higher temperature to produce complete cavity filling and an allegedly smooth metal surface (at least for some aspect ratios). However, this process uses only a single deposition step to produce a uniform metal composition. Thus, this process does not permit the metal in the cavity or at the bottom of the cavity to be separately optimized to accommodate junction spiking considerations or increased electromigration in the cavity.

Method of Reducing the Surface Roughness

The present application discloses a method of minimizing the volume of the depressions in metal cavity filling processes. In this process, a conformal first metal layer is deposited by chemical vapor deposition, long-throw sputtering, collimated sputtering, or ionized physical vapor deposition, to partially fill the cavity. This layer is preferably deposited at a low temperature (e.g. less than 300 degrees C.) and lower deposition pressure (if deposited by sputtering). Subsequently, if high pressure extrusion/reflow is used to fill the bulk of the S cavity, a second metal layer is deposited by sputtering at temperatures greater than 350 degrees C. and at high power (e.g. greater than 10 kW) to close the mouth of cavity. The second metal layer is then preferably forced into the remaining volume of the cavity. Since part of the cavity was filled with the first metal layer before the high pressure metal extrusion/reflow, less material is required to be transported into the cavity. Therefore, a smaller depression above the cavity is produced. This method is particularly advantageous in multi-level interconnect applications involving aluminum cavity filling, but is also applicable to other metallization systems.

Advantages of the disclosed methods and structures include:
 manufacturable;
 existing hardware can be used for the two-step aluminum cavity filling process;
 the volume of depressions is reduced, which reduces the surface topography; and
 surface roughness has also been found to be reduced.

BRIEF DESCRIPTION OF THE DRAWING

The disclosed inventions will be described with reference to the accompanying drawings, which show important sample embodiments of the invention and incorporated in the specification hereof by reference, wherein.

DETAILED DESCRIPTION OF PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Sample Embodiment

Figure 1:
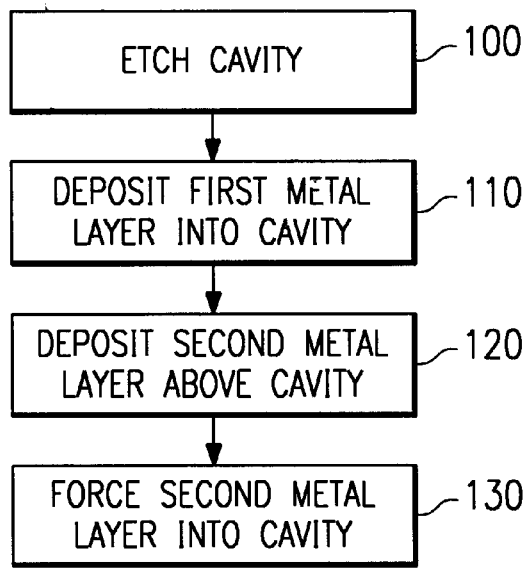
FIG. 1 shows a process flow for fabricating metal-filled cavities in accordance with preferred embodiments of the present invention.

FIG. 1 shows a process flow for fabricating a metal-filled cavity having a reduced depression. This process will be explained in conjunction with the cross-sectional diagrams of FIGS. 2A–2C.

Figure 2A:
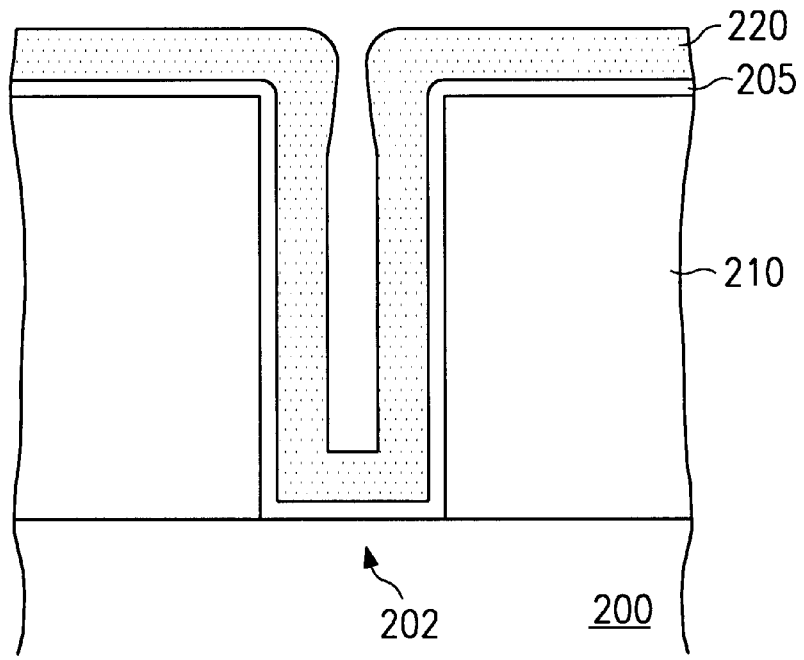
FIGS. 2A–2C schematically illustrate the formation of metal-filled cavities with a reduced depression.

As shown in FIG. 2A, a cavity 202 (e.g. contact or via hole) has been etched (step 100) through a dielectric layer 210 (e.g. BPSG, TEOS, etc.) to expose an underlying layer 200, followed by the deposition of barrier and/or adhesion or liner layers 205 (e.g. titanium/TiN) to line the cavity 202. Subsequently, a conformal first conductive layer 220 (e.g. aluminum alloy) is deposited (step 110) to partially fill the cavity 202, as shown in FIG. 2A. (As compared to barrier and adhesion layers, which typically fill less than 10 percent of the cavity volume, the bottom conductive layer disclosed herein fills more than 10 percent of the cavity volume, and preferably more than 30 percent of the cavity volume.) This layer is preferably deposited at low temperature (e.g. less than 300 degrees C.) and low deposition pressure (if deposited by long-throw sputtering).

Figure 2B:
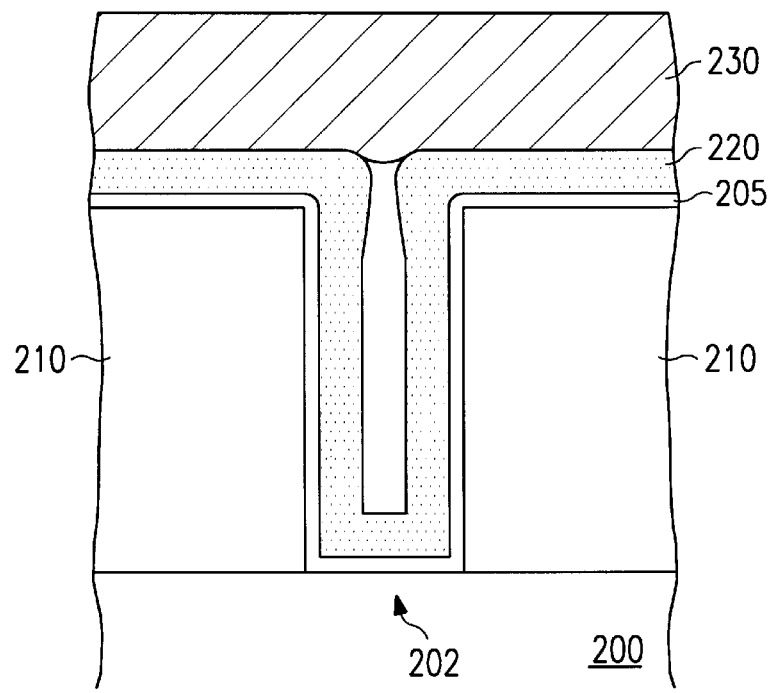
Figure 2C:
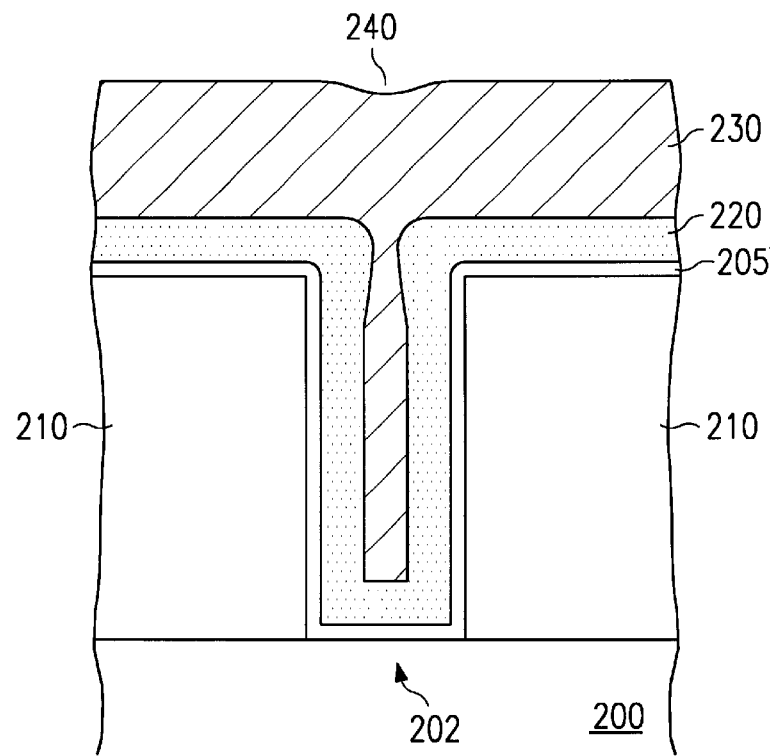
Figure 3A:
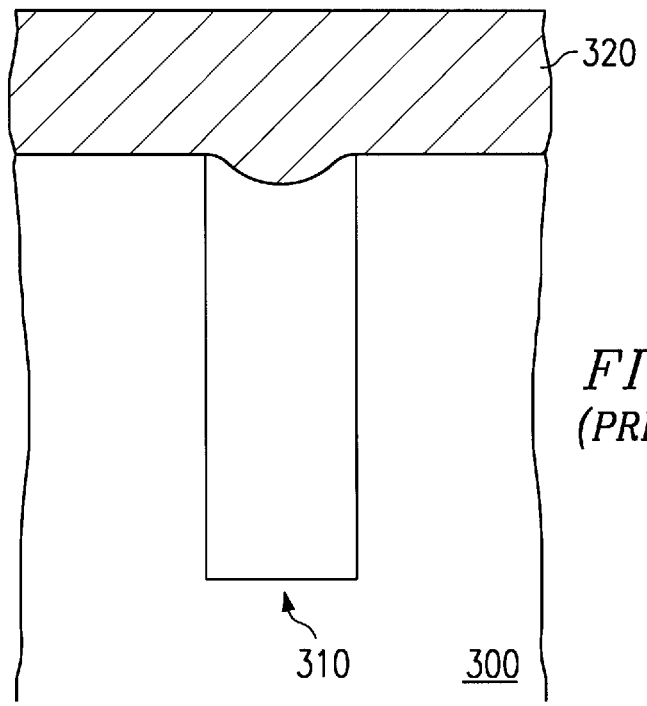
FIGS. 3A and 3B show a prior art depression formation over an aluminum-filled cavity.
Figure 3B:
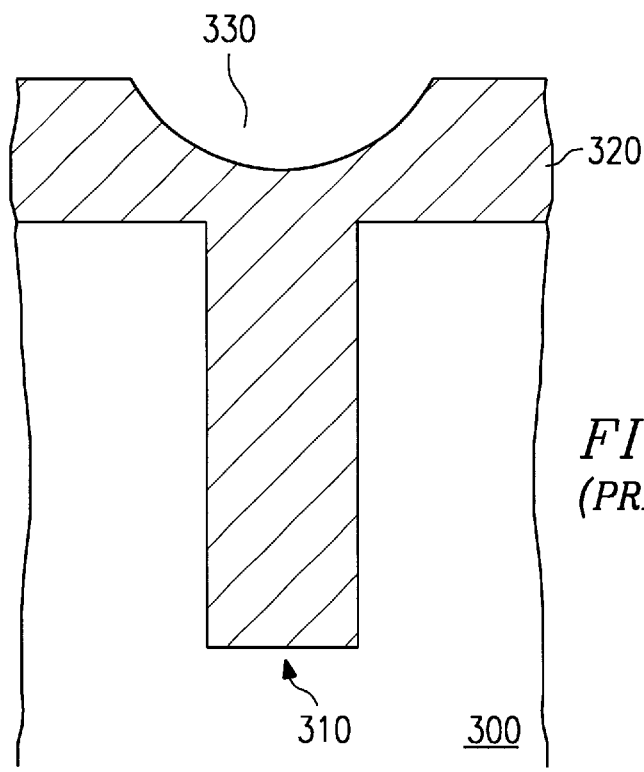
Figure 4:
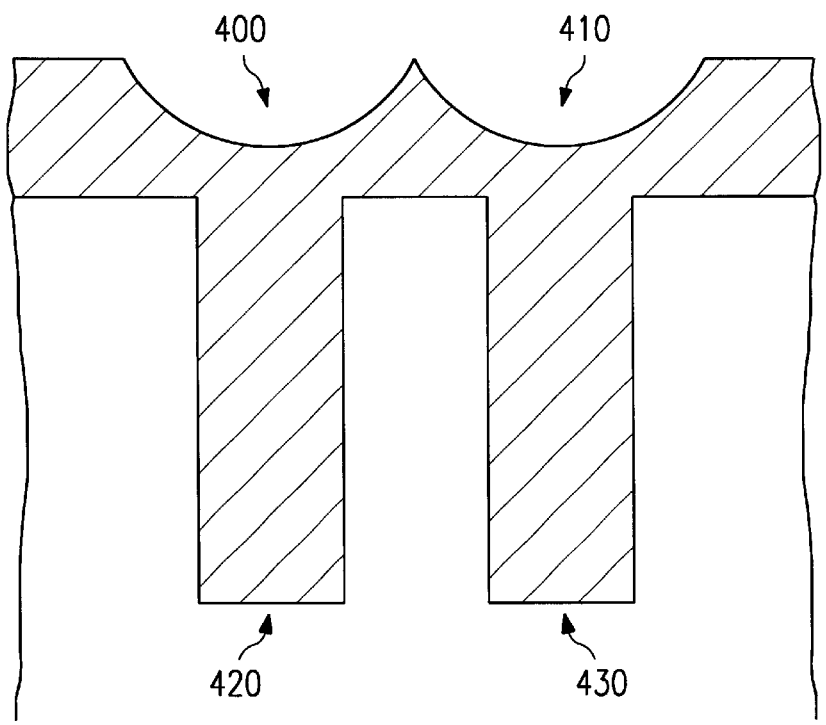
FIG. 4 is a prior art cross-sectional diagram of two over-lapping depressions.
Figure 5:
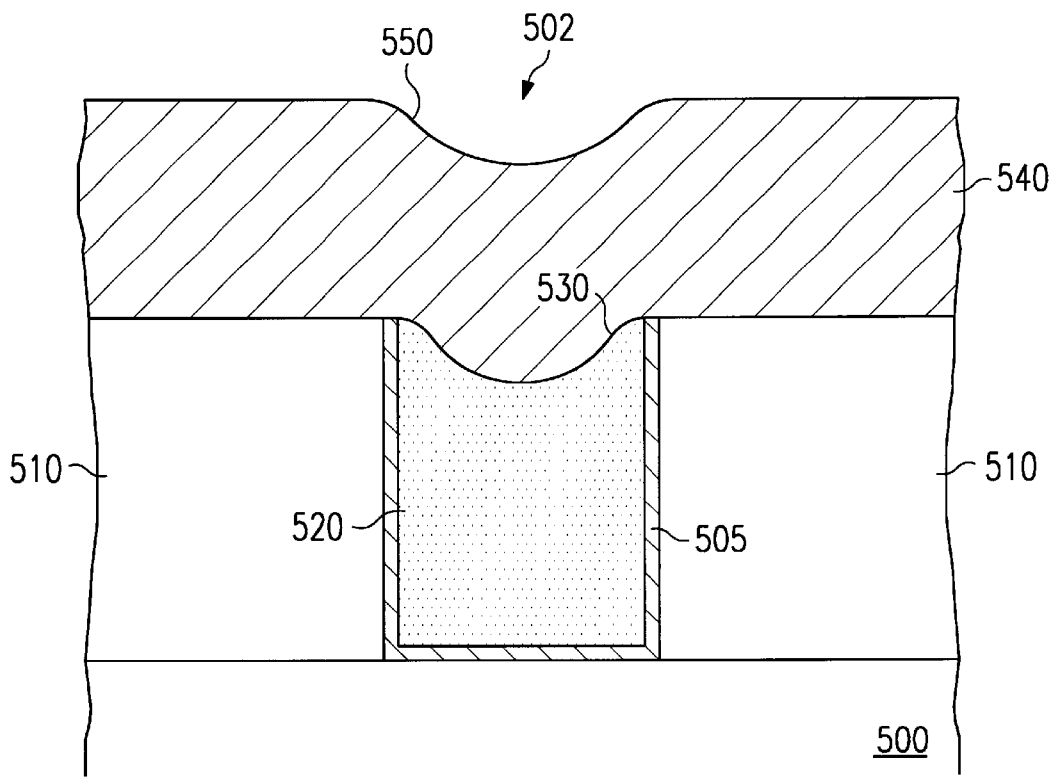
FIG. 5 shows a prior art integrated circuit structure having aluminum plugs.

A second metal layer 230 (e.g. aluminum alloy) is then deposited (step 120) at a temperature greater than 350 degrees C. and at high power (e.g. greater than 10 kW) to close the mouth of the cavity, which is illustrated in FIG. 2B. This top metal layer 230 is then forced into the remaining volume of the cavity 202 (step 130), as can be seen in FIG. 2C, by high pressure argon or other gas (e.g. at 60–90 MPa at: a susceptor temperature of 440 to 450 degrees C., which implies al wafer temperature of about 380 degrees C.) As is well known to those skilled in the art, the pressure and temperature can be traded off. At higher temperatures, the yield strength of the aluminum is less, and therefore less pressure is required to both force the metal into the cavity and eliminate voids (e.g. the pressure can range from 0–95 MPa). For example, if the susceptor temperature is held to a minimum temperature of at least 460 degrees C., then a minimum pressure of at least 45 MPa has been found to be sufficient. Similarly, if the susceptor temperature is held to a minimum temperature of at least 500 degrees C., then a minimum pressure of at least 30 MPa has been found sufficient. (1 MPa is approximately equal to 10 atmospheres of pressure.)

Since part of the cavity 202 was filled with a conductive material 220 before the high pressure metal extrusion/reflow (step 130), less material is required to be transported into the cavity 202. Thus, a smaller depression 240 is formed above the cavity, which is now completely filled with conductive layers 220 and 230 (e.g. aluminum alloy), shown in FIG. 2C. Assuming the top metal layer 230 is planar before the extrusion process, the volume of the depressions 240 produced using preferred embodiments of the present invention approximately equals the volume of the cavity minus the volume of the bottom conductive layer within the cavity. Since the volume of the depression produced by prior art methods approximately equals the volume of the cavity, the volume of the depression shown in FIG. 2C equals the volume of the depression produced by prior art methods minus the volume of the bottom conductive layer in the cavity. Therefore, the volume of the depression created using embodiments of the present invention is less than the volume of the depression formed by prior art methods.

Alternate Bottom Conductive Layer Embodiment: Copper

In an alternative embodiment, the bottom conductive layer can consist essentially of copper. In this embodiment, a good diffusion barrier 205 is preferably used.

Alternate Bottom Conductive Layer Embodiment: Silicon

In a further alternative (but less preferred) embodiment, the bottom layer can be composed of silicon to partially fill the cavities prior to the deposition and extrusion of the top metal layer.

Alternate Bottom Conductive Layer Embodiment: Germanium

In a further alternative embodiment, the bottom layer can be composed of germanium to partially fill the cavities prior to the deposition and extrusion of the top metal layer.

Alternate Top Metal Layer Embodiment: Copper

Alternatively, copper can be used as the top metal layer, since it is a candidate metal for use in force-filling processes.

First Bottom Conductive Layer Deposition Embodiment: CVD

Figure 7A:
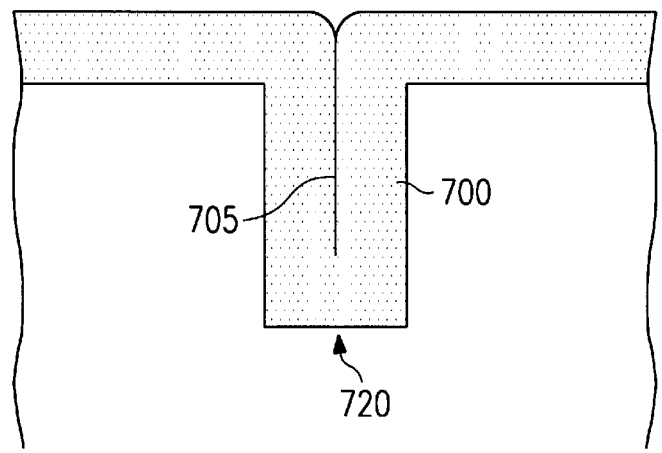
FIGS. 7A and 7 show the prior art filling of cavities using a CVD process followed by metal extrusion.
Figure 7B:
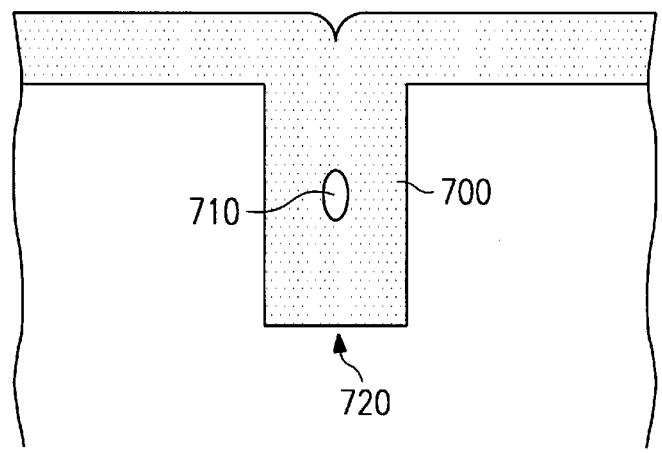

In a preferred embodiment, the bottom conductive layer can be deposited by a chemical vapor deposition (CVD) process, using a dimethyl-aluminum-hydride (DMAH) source, to partially fill the cavities (filling more than 10 percent of the volume of the cavities, and preferably more than 30 percent of the cavity volume). Since only a fraction of the total metal thickness is deposited by an expensive CVD process, the cost of producing devices using embodiments of the present invention is reduced. Furthermore, by performing a subsequent extrusion/reflow process, the bubble, which typically forms in CVD filling processes, seen in FIG. 7B, can be flattened out.

The following data gives results from actual test runs using preferred embodiments of the present invention. After the deposition of a liner layer of titanium/TiN, the process proceeded with the CVD of aluminum, followed by the deposition by sputtering and extrusion of an additional layer of aluminum.

CVD Al thickness: 60 nm
Sputtered Al—Cu
   Power: 16 kW
   Temp: 450 degrees C.
   Ar Pressure: 72 MPa Experimental results confirmed that little or no recess was formed over the cavities using the process parameters listed above. Therefore, by using CVD aluminum prior to depositing by sputtering an aluminum alloy and extruding the aluminum alloy into the cavities, a smooth surface over the cavities can be obtained.

Second Bottom Conductive Layer Deposition Embodiment: Ionized PVD

Figure 6:
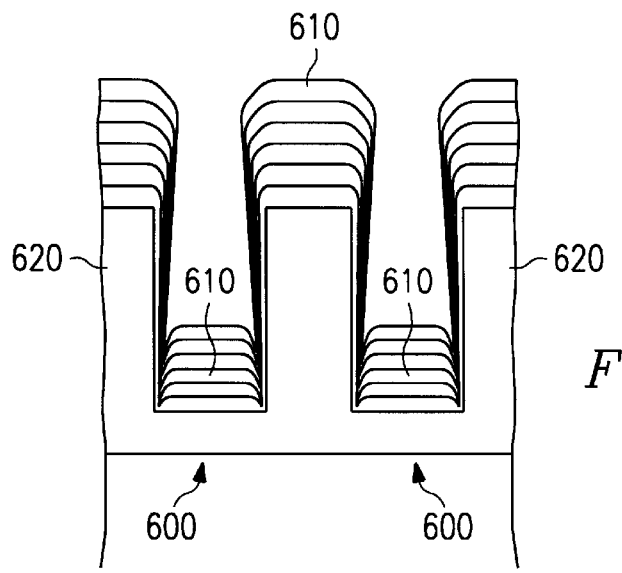
FIG. 6 illustration the partial filing of cavities using an ionized PVD process.

Alternatively, the bottom conductive layer can be deposited by an ionized physical vapor deposition (PVD) process to partially fill the cavities (filling more than 10 percent of the volume of the cavities, and preferably more than 30 percent of the cavity volume). The ionized PVD process produces a structure similar to the one shown in FIG. 6. As can be seen, a rounded mass 610 of the first conductive layer is deposited onto the surface of the dielectric 620 and the bottom of the cavity 600 to partially fill the cavity 600 prior to completely filling the remaining volume of the cavity 600 in accordance with embodiments described herein. The rounded mass 610 of the first conductive layer helps to reduce the cavity volume, and hence surface topography and surface roughness.

Third Bottom Conductive Layer Deposition Embodiment: Collimated Sputtering

Alternatively, the bottom conductive layer can be deposited by collimated sputtering to partially fill the cavities (filling more than 10 percent of the volume of the cavities, and preferably more than 30 percent of the cavity volume).

Fourth Bottom Conductive Layer Deposition Embodiment: Long-Throw Sputtering

Alternatively, the bottom conductive layer can be deposited by long-throw sputtering, in which the distance between the target and the wafer is increased, to partially fill the cavities (filling more than 10 percent of the volume of the cavities, and preferably more than 30 percent of the cavity volume).

Fifth Bottom Conductive Layer Deposition Embodiment: Combination

In a further alternative embodiment, it is possible to combine more than one of the above listed preliminary deposition steps. For instance, a step such as ionized physical vapor deposition, which produces metal on the bottom of a contact, can be combined with a CVD process, which provides some metal deposition on the sidewalls of the contact.

First Top Metal Layer Deposition Embodiment: Sputtering/High Pressure Extrusion In a preferred embodiment, the top metal layer is deposited by sputtering to close the mouth of the cavity, as is done in a normal Forcefill (TM) process. This top metal layer is then forced into the remaining volume of the cavity using a high pressure extrusion process.

Second Top Metal Layer Deposition Embodiment: CVD/High Pressure Extrusion

In an alternative embodiment, the top metal layer can be deposited by chemical vapor deposition (CVD). However, CVD processes are typically more expensive than sputtering deposition processes, and hence are less preferred.

Third Top Metal Layer Deposition Embodiment: No High Pressure Extrusion

Alternatively, after the deposition of the bottom conductive layer, the top metal layer can be deposited by sputtering at an elevated temperature (e.g. greater than 350 degrees C.) and at a low deposition rate (e.g. less than 3 kW) to promote the transport of the top metal layer into the cavity. After the deposition of the top metal layer, and without a vacuum break, an in-situ thermal anneal at a temperature greater than 350 degrees C. is preferably performed to achieve complete filling of the cavities. However, this anneal is optional if the cavities are completely filled after the top metal deposition.

Alternate Cavity-Filling Embodiment: Graded Deposition

In an alternative embodiment, a graded deposition process is performed prior to the force-fill. The deposition process starts at relatively low temperature (e.g. 200 degrees C.), to achieve some initial deposition of a metal within the cavity. The temperature is then raised to a normal pre-force-fill temperature (e.g. 350 to 465 degrees C.) to deposit the metal over the top of the cavity in order to provide the starting point for the force-fill process of the metal. For reference, the melting point of aluminum is 660 degrees C., or 933 degrees Kelvin, and two-thirds of the melting point of aluminum is 622 degrees Kelvin, or 339 degrees C. Thus, the initial deposition is performed at less than two-thirds of the aluminum melting point, while the subsequent deposition is performed at greater than two-thirds of the aluminum melting point.

Alternate Cavity-Filling Embodiment: Choked-Off Cavity

Figure 8A:
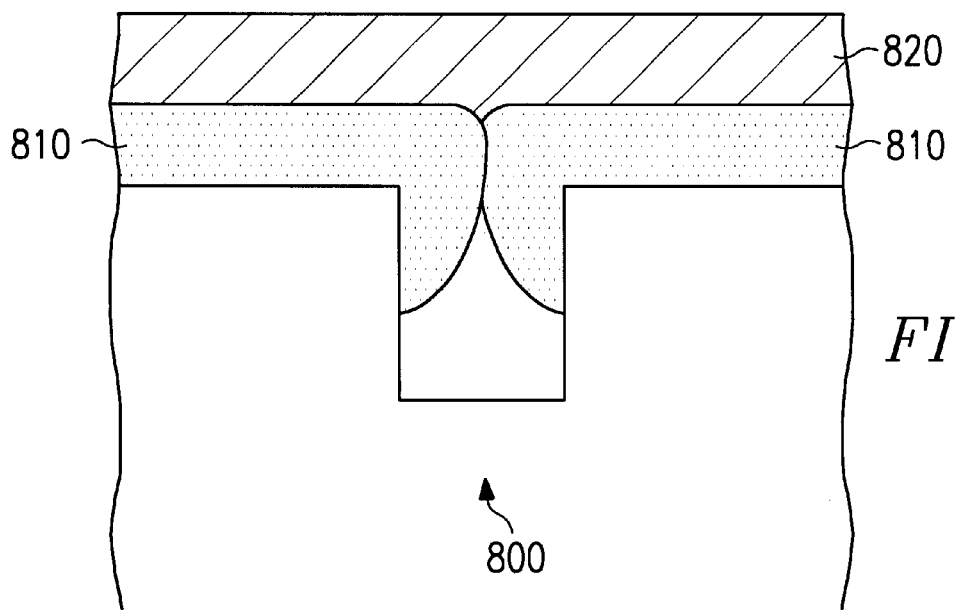
FIGS. 8A and 8B schematically illustrate one deposition embodiment of the first metal layer.

Note that it is not necessary for the bottom conductive layer to leave an opening at the mouth of the contact or via hole. Alternatively, as shown in FIG. 8A, as long as at least 10 percent (but preferably 30 percent) of the cavity is filled with metal prior to the top metal deposition, this first deposition 810 can choke off the cavity 800, since the force-fill step of the top metal layer 820 will nevertheless succeed in filling the cavity 800 (assuming that the first layer 810 also softens sufficiently at the temperature of the force-fill process, e.g. where the first 810 and second 820 layers are both aluminum or aluminum alloys).

Figure 8B:
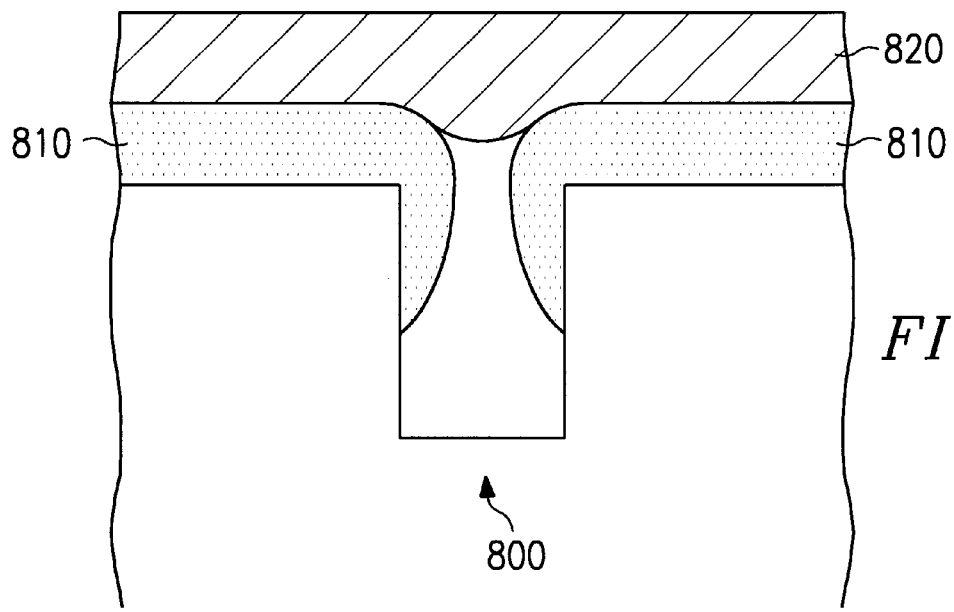

Alternate Cavity-Filling Embodiment: Deposition of Bottom Conductive Layer on Sides of Cavity Alternatively, as shown in FIG. 8B, the bottom conductive layer 810 can be deposited only on the sides of the cavity 800, followed by the deposition of the top metal layer 820 over the top of the cavity 800. After extruding the top metal layer 820 into the cavity 800, in accordance with embodiments of the present invention, a depression with a reduced volume will form above the cavity.

Alternate Conductive Coating Embodiment: Liner Layer

Alternatively, a liner layer, containing silicon or germanium (e.g. TiSi2) can be deposited before the bottom aluminum layer to lower the melting point of the aluminum alloy, and increase the diffusivity of aluminum. This enables faster aluminum transport at lower temperatures, and thus a lower temperature is adequate for complete filling.

Alternate Metal Stack Embodiment: Different Aluminum Alloy Compositions

In a contemplated class of alternative embodiments, the use of two stages of metal deposition is exploited to permit the creation of differing aluminum alloy compositions in the contact or via hole and on the surface of the dielectric. Preferably, the aluminum alloy in the contact has a higher percentage of both silicon (or germanium) and of copper than does the aluminum on the dielectric surface. In a sample embodiment of this type, the first aluminum deposition contains 1 percent of silicon, and 1 percent of cooper.

The high concentration of silicon or germanium close to the contact to silicon provides the necessary protection against spiking, while the reduced (or eliminated) silicon or germanium dopant in the metal on the dielectric surface removes the risk of any etching problems caused by precipitated silicon residues.

The gradation in the copper concentration between the top and bottom layers of aluminum has a similarly beneficial effect. The use of a higher copper fraction in the bottom metal layer provides increased electromigration resistance in the areas around the top of contact or via holes, since the bottom metal layer provides a higher fraction of the total metal volume in these locations. The copper content of the top aluminum layer is preferably high enough to achieve at least a half percent of copper in the total layer composition.

For a sample embodiment with 300 nanometers (0.3 microns) contact width, sample dimensions are: total metallization thickness (first and second layers combined) 540 nm; and thickness of the first layer: 60 nm.

Alternate Metal Stack Embodiment: Copper/Aluminum

In an alternative embodiment, the bottom metal layer can consist of aluminum, or an aluminum alloy, while the top metal layer is composed of copper. Optionally, barrier and adhesion layers, and possibly liner layers (e.g. TiSi2), can be deposited prior to the aluminum layer. This provides the advantage of aluminum-plug technology, as described above, while using copper where it is most amenable to damascene processing.

Alternate Metal Stack Embodiment: Aluminum Extrusion/Copper

In a further alternative embodiment, the bottom metal layer can consist of copper, while the top metal layer, which is forced into the cavity, is composed of aluminum, or an aluminum alloy. This is more preferred for via structures rather than contact structures. However, if this were to be used at the contact level, a very good diffusion barrier, such as tungsten nitride or titanium silicon nitride, would, of course, be required.

Alternate Metal Stack Embodiment: Aluminum Reflow/Copper

Alternatively, the cavity can be filled initially with a layer of copper (e.g. at least 10 percent of the cavity volume, but preferably 30 percent) at a low temperature (e.g. less than 300 degrees C.), followed by the deposition of a top aluminum layer at high temperature (e.g. greater than 350 degrees C.) to fill the remaining volume of the cavity with metal. This process uses two deposition steps to separately optimize the metal in the cavity and the metal at the bottom of the cavity to accommodate junction spiking considerations and to increase the electromigration resistance in the cavity. Of course, if this were to be used in contact applications, a diffusion barrier beneath the copper layer, such as tungsten nitride or titanium silicon nitride, would be required.

According to a disclosed class of innovative embodiments, there is provided: A method of forming an integrated circuit metallization layer which fills an opening in an underlying layer, comprising the steps of: (a.) depositing a conductive layer to fill at least 10 percent of the volume of said opening; (b.) depositing a metal layer over said conductive layer and the top of said opening; and (c.) extruding said metal layer into said opening under high pressure.

According to another disclosed class of innovative embodiments, there is provided: A method of forming an integrated circuit metallization layer which fills an opening in an underlying layer, comprising the steps of: (a.) depositing a first metal layer to fill at least 10 percent of the volume of said opening; (b.) depositing a second metal layer having a different composition than said first metal layer over said first metal layer and over the top of said opening in a separate step; and (c.) filling said opening with said second metal layer.

According to another disclosed class of innovative embodiments, there is provided: A method of fabricating an integrated circuit metallization structure, comprising the steps of: (a.) conformally depositing a first metal layer predominantly comprising aluminum over a dielectric layer and partially within openings in said dielectric layer; (b.) depositing a second metal layer predominantly comprising aluminum over said first metal layer and the top of said openings; and (c.) extruding said second metal layer into said openings under high pressure; wherein said first metal layer contains a higher fraction of copper atoms than said second metal layer.

According to another disclosed class of innovative embodiments, there is provided: A method of fabricating an integrated circuit structure, comprising the steps of: (a.) depositing a liner layer consisting of layers of titanium and titanium nitride over a dielectric and within openings in said dielectric; (b.) depositing a first metal layer predominantly comprising aluminum over said liner layer and partially within said openings; (c.) depositing a second metal layer predominantly comprising aluminum over said first metal layer and the tops of said openings; and (d.) extruding said metal into said openings under high pressure to completely fill said openings; wherein a depression having a reduced volume is formed over said openings.

According to another disclosed class of innovative embodiments, there is provided: A method of forming an integrated circuit metallization layer which fills an opening in an underlying layer, comprising the steps of: (a.) depositing a metal using a physical vapor deposition process at a low temperature to fill at least 10 percent of the volume of said opening; (b.) depositing said metal at a high temperature over the top of said opening; and (c.) extruding said metal into said opening under high pressure to completely fill said opening; wherein said low temperature is less than two-thirds of the melting point of said metal and said high temperature is greater than two-thirds of the melting point of said metal; wherein a depression having a reduced volume is formed over said openings.

According to another disclosed class of innovative embodiments, there is provided: An integrated circuit contact/via structure, comprising: a metallization layer having a graded composition extending downwardly into openings in an interlevel dielectric and also laterally, in patterned stripes, across the surface of said dielectric; wherein portions of said metal stack within said openings have a different average composition than portions of said metal stack on the surface of said dielectric.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

It should be noted that the number of layers of metallization described above does not implicitly limit any of the claims, which can be applied to processes and structures with more or fewer layers.

Of course, the specific deposition methods for the metal layers, layer compositions, and layer thicknesses given are merely illustrative, and do not by any means delimit the scope of the claimed inventions. For example, plasma enhanced CVD can be used instead of the CVD of the presently preferred embodiment.

Similarly, a wide variety of materials, and of combinations of materials, can be used to implement the metal layers. For example, the bottom conductive layer can be any good conductor (e.g. Al—Cu(0–5 percent), Al—Si(0–5 percent), Al—Ge(0–5 percent), Al—Cu(0–5 percent)Ge(0–5 percent), Cu—Sn(0–5 percent), Cu—Mg(0–5 percent), Cu—Cr(0–5 percent), Cu—Al(0–5 percent)). (However, titanium is not preferred due to a relatively poor resistivity.) In addition, the top metal can be any metal which is suitable for forcefill methods (metals with a sufficiently good combination of conductivity with softness at acceptable temperatures).

The invention can also be adapted to other combinations of dielectric materials in the interlevel dielectric. For example, phosphosilicates, germanosilicate, arsenosilicates or combinations thereof can be used instead of the BPSG of the presently preferred embodiment.

Similarly, the barrier or liner layer can be composed of other materials, such as: TiAlN, TiSiN, WNx, WSiN, TiWN, TaNx, TaSiN, CrN, or CrAlN, instead of the TiN of the presently preferred embodiment.

What is claimed is:

1. A method of forming an integrated circuit metallization layer which fills an opening in a dielectric layer, comprising the steps of;

forming said opening in said dielectric layer, after forming said opening, depositing an adhesion layer in said opening;

depositing a conductive layer predominantly comprising aluminum to fill at least 10 percent of a volume of said opening;

depositing a metal layer predominantly comprising aluminum over said conductive layer and over the dielectric layer; and extruding said metal layer into said opening under high pressure.

2. The method of claim 1, wherein said opening has a height to width ratio of at least 3:1.

3. The method of claim 1, wherein said conductive layer is deposited at a temperature less than 300 degrees C.

4. The method of claim 1, wherein said metal layer is deposited at a temperature greater than 350 degrees C.

5. The method of claim 1, wherein said conductive layer is deposited by a chemical vapor deposition process.

6. The method of claim 1, wherein said conductive layer fills thirty percent of the volume of said opening.

* * * * *